(12) United States Patent
Seko

(10) Patent No.: US 6,864,119 B2
(45) Date of Patent: Mar. 8, 2005

(54) COF SEMICONDUCTOR DEVICE AND A MANUFACTURING METHOD FOR THE SAME

(75) Inventor: Toshiharu Seko, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/668,182

(22) Filed: Sep. 24, 2003

(65) Prior Publication Data

US 2004/0063332 A1 Apr. 1, 2004

(30) Foreign Application Priority Data

Oct. 4, 2002 (JP) ........................................ 2002-292597

(51) Int. Cl.⁷ ................................................. H01L 21/44
(52) U.S. Cl. ...................... 438/106; 250/500; 250/512; 250/513; 250/514; 250/518
(58) Field of Search ................................ 252/500, 512, 252/513, 514, 518

(56) References Cited

U.S. PATENT DOCUMENTS 6,592,783 B2 * 7/2003 Kumakura et al. ......... 252/500

FOREIGN PATENT DOCUMENTS

| JP | 60-262430 | 12/1985 |
| JP | 63-151033 | 6/1988 |

* cited by examiner

Primary Examiner—David Nelms
Assistant Examiner—Mai-Huong Tran
(74) Attorney, Agent, or Firm—Nixon & Vanderhye, P.C.

(57) ABSTRACT

A manufacturing method for a COF semiconductor device according to the present invention comprises:

Step (A) of applying an insulating resin composition to a surface of an insulating tape on the surface of which a plurality of wiring patterns is arranged;

Step (B) of pressably contacting a semiconductor element to the wiring patterns in the condition wherein the insulating resin composition is not yet cured; and Step (C) of fixing the semiconductor element to the wiring patterns so as to be electrically connected by curing the insulating resin composition, wherein the manufacturing method for a COF semiconductor device further includes Step (D) of pre-heating the insulating tape from the rear surface side before, during, and/or after the application of the insulating resin composition.

8 Claims, 6 Drawing Sheets

COF SEMICONDUCTOR DEVICE AND A MANUFACTURING METHOD FOR THE SAME

CROSS-REFERENCE TO RELATED APPLICATION

This application is related to Japanese application No. 2002-292597 filed on Oct. 4, 2002, whose priority is claimed under 35 USC §119, the disclosure of which is incorporated by reference in its entirety.

BACKGROUND OF THE INVENTION

1. Field of the Invention

The present invention relates to a COF (Chip On Film) semiconductor device and a manufacturing method for the same, wherein semiconductor elements are mounted on and conjugated to a flexible printed circuit.

2. Description of the Background Art

Thin film insulating tapes that are freely foldable have been utilized in COF semiconductor devices taking advantage of their properties. Each of the patterned wires arranged on the surface of such a thin film insulating tape is electrically connected to a corresponding terminal of a semiconductor element. An external connector of the patterned wires is connected to a liquid crystal panel, a printed circuit board, and the like. A solder resist is applied to the exposed portions of the patterned wires other than the above so that the insulated condition is secured.

Connection and molding methods such as MBB (Micro Bump Bonding), NCP (Non-Conductive Paste), which have attracted attention in recent years, and ACP (Anisotropic Conductive Paste) are known as one of manufacturing methods for COF semiconductor devices that are effectively used as prior arts for an element having multi-pins, a narrow pitch and edge touch.

These methods are manufacturing methods for intervening an insulating resin composition between a semiconductor element and a flexible printed circuit so as to connect protruding electrodes of the semiconductor element with the wiring pattern of the flexible printed circuit and so as to, at the same time, mold the electrodes and the wiring pattern in resin. Here, the application method for the insulating resin composition is not specified.

A manufacturing method for a COF semiconductor device (Japanese Unexamined Patent Publication No. S60(1985)-262430, for example) according to the conventional example 1 using the above described MBB is shown in FIGS. 5(a) to 5(d). According to the conventional example 1, first, an insulating resin composition 22 is applied to the position, on a wiring pattern 2 of a flexible printed circuit, to which a plurality of protruding electrodes (bumps) of a semiconductor element is conjugated as a resin discharging nozzle 8 is shifted, as shown in FIGS. 5(a) and 5(b). A photo-curing or thermosetting resin is used for the above insulating resin composition 22. Here, symbol 1 in FIGS. 5(a) to 5(d) indicates a thin film insulating tape and symbol 5 indicates a solder resist. Then, as shown in FIG. 5(c), a plurality of protruding electrodes 9 of a semiconductor element 3 is positioned on the wiring pattern 2. Then, pressure is applied to the semiconductor element 3, which has been placed on the insulating resin composition 22, so that the insulating resin composition 22 between the protruding electrodes 9 and the wiring pattern 2 are expanded resulting in electrical connections between the protruding electrodes 9 and the wiring pattern 2 due solely to pressure proceeding. At the same time, the insulating resin composition 22 is pressed out to the periphery of semiconductor element 3. Here, the arrows denoted by the symbol 21 indicate pressure while the arrows denoted by symbol 12 indicate the flow of resin toward the outer periphery of the semiconductor element. After that, as shown in FIG. 5(d), the insulating resin composition 22 in this condition is cured by means of light or heat so as to fix the semiconductor element 3 on the flexible printed circuit. Here, the arrows denoted by the symbol 23 indicate light irradiation or the application of heat.

A manufacturing method for a COF semiconductor device (Japanese Unexamined Patent Publication No. S63(1988)-151033, for example) according to the conventional example 2 using the above described MBB is shown in FIGS. 6(a) to 6(d). Here, the same symbols in FIGS. 5(a) to 5(d) of the conventional example 1 are attached to the same elements in FIGS. 6(a) to 6(d). According to the conventional example 2, first, the insulating resin composition 22 is applied to the position, on the wiring pattern 2 of a flexible printed circuit, to which a plurality of protruding electrodes of a semiconductor element is conjugated as the resin discharging nozzle 8 is shifted, as shown in FIGS. 6(a) and 6(b). A thermosetting resin is used for the above insulating resin composition 22. Then, as shown in FIG. 6(c), the respective protruding electrodes 9 of the semiconductor element 3 are positioned on the wiring pattern 2. After that, the semiconductor element 3 that has been placed on the insulating resin composition 22 is pressed to the flexible printed circuit using a pulse heat application tool (not shown) so that the insulating resin composition 22 on the wiring pattern 2 is pressed out to the periphery. After that, as shown in FIG. 6(d), the above described pulse heat application tool is energized so as to apply heat to the semiconductor element 3 in the condition wherein the semiconductor element 3 is pressed to the flexible printed circuit and, thereby, the insulating resin composition 22 is thermo-set so as to fix the semiconductor element 3 on the flexible printed circuit. At the same time, the respective protruding electrodes 9 and the wiring pattern 2 are electrically connected. Here, the arrows denoted by symbol 24 FIG. 6(d) indicate pulse heat application in a condition wherein pressure is applied.

One problem concerning the conventional example 1 is the case wherein bubbles 13 (shown as white dots) occur when the insulating resin composition 22 is cured after the insulating resin composition 22 is applied to a thin film insulating tape 1, to which the semiconductor element 3 is contacted by means of pressure proceeding (see FIG. 5(d)). The above case is described in further detail as follows: The bubbles 13 may occur due to factors such as a), b) and c): a) air (failure of fill-in) that becomes enclosed at the time when the semiconductor element 3 is contacted by means of pressure proceeding because of gaps between resin lines of the insulating resin composition 22 in the form of ridges applied by means of the resin discharging nozzle 8 or because of unevenness of the surface of the resin (see FIG. 5(b)) due to application of the insulating resin composition 22 over regions with and without the wiring pattern 2; b) outgassing generated at the time of the curing of the insulating resin composition 22; and c) moisture produced at the time when the thin film insulating tape 1, which has absorbed moisture, is dried. As described above, disadvantages such as leak of current between the protruding electrodes 9 as well as corrosion of aluminum electrodes of the semiconductor element, for example, may occur depending on the degree of occurrence of the bubbles 13 or on the condition of utilization of the COF semiconductor device having the bubbles 13 in the insulating resin composition 22 after curing.

In addition, the surface of insulating resin composition 22 after application is uneven in the same manner as in the conventional example 1 (see FIG. 6(b)) in the case wherein a pressure application tool that is constantly heated or a pressure application tool that is pulse-heated is used as in the conventional example 2. Therefore, there is a problem wherein the bubbles 13, shown as white dots in FIG. 6(d), remain in the insulating resin composition 22 after curing.

SUMMARY OF THE INVENTION

The present invention solves the above described problems and provides a COF semiconductor device and a manufacturing method for the same wherein bubbles, and/or failure of fill-in, occurring in the insulating resin composition at the time of the conjugation and molding of a semiconductor element to a wiring pattern of a thin film insulating tape and molding were reduced with a high reliability.

In order to resolve the above described problem a manufacturing method for a COF semiconductor device according to the present invention comprises:

Step (A) of applying an insulating resin composition to a surface of an insulating tape on the surface of which a plurality of wiring patterns is arranged;

Step (B) of pressably contacting a semiconductor element to the wiring patterns in the condition wherein the insulating resin composition is not yet cured; and Step (C) of fixing the semiconductor element to the wiring patterns so as to be electrically connected by curing the insulating resin composition, wherein the method further includes Step (D) of pre-heating the insulating tape from the rear surface side before, during, and/or after the application of the insulating resin composition.

That is to say, according to the present invention the insulating resin composition is pre-heated to a temperature such that removal of bubbles is possible via the insulating tape that has been pre-heated from the rear surface side of the insulating tape, wherein there are no wiring patterns, before, during and/or after the application of the insulating resin composition. Thereby, the moisture absorbed by the insulating tape as well as the outgassing at the time of the curing of the resin are removed in advance, and the insulating resin composition is smoothed to reduce the unevenness of the resin ridges so that air can easily escape to the outside at the time when pressure is applied to the semiconductor element placed on the insulating resin composition. Accordingly, bubbles and/or failure of fill-in can be greatly reduced in the insulating resin composition at the time of conjugation of the semiconductor element to the wiring pattern on the insulating tape and molding with the insulating resin composition. Accordingly, a COF semiconductor device having a high reliability can be gained wherein bubbles, and/or failure of fill-in, can be greatly reduced in the insulating resin composition at the time of conjugation of the semiconductor element to the wiring pattern on the insulating tape and molding with the insulating resin composition, wherein leaks between electrodes of the semiconductor elements and corrosion of the aluminum electrodes of the semiconductor element do not occur.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
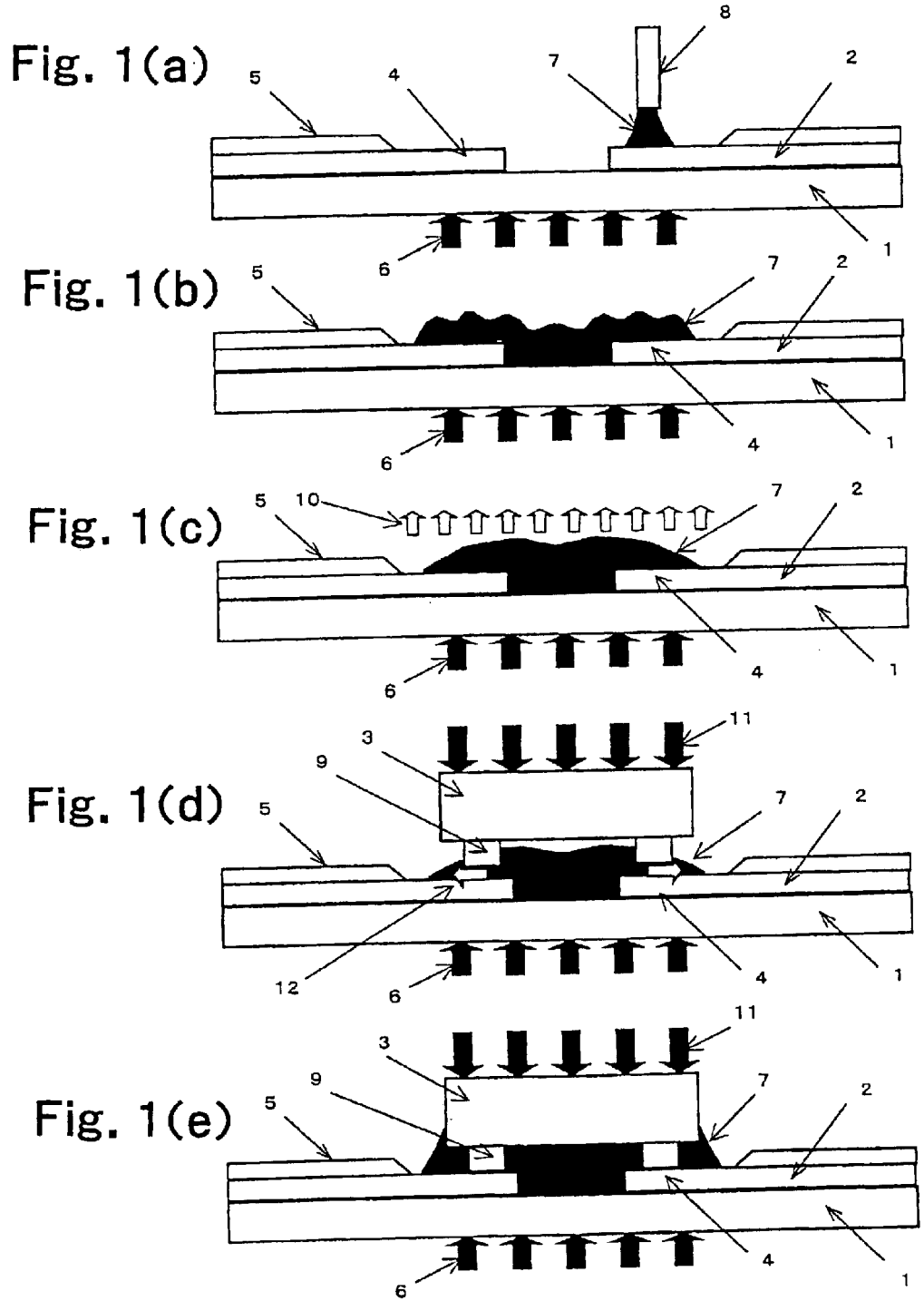
FIGS. 1(a) to 1(e) are diagrams showing steps of a manufacturing method for a COF semiconductor device according to Embodiment 1 of the present invention.

Though the type of the thin film insulating tape of the present invention is not particularly limited as long as it has insulating properties, and the wiring patterns (hereinafter simply referred to, in some cases, as the wiring) can be formed on the surface of the thin film insulating tape. However, it is preferable for the thin film insulating tape to be freely foldable, and a polyimide-based insulating tape such as polyimide or Kapton can preferably be used. Though the thickness of the polyimide-based insulating tape is not particularly limited, a thin-type is preferable in order to secure high flexibility and, concretely, a range varying of from 15 $\mu$m to 40 $\mu$m is preferable and, more concretely, a thickness of 15 $\mu$m, 20 $\mu$m, 25 $\mu$m, 38 $\mu$m or 40 $\mu$m can preferably be used.

Though the type of wiring patterns is not particularly limited, as long as they are formed in appropriate patterns in accordance with the structure or application of the semiconductor device and have conductivity, the wiring made of a thin metal film, for example, can be cited. Though the type of metal used for such the wiring is particularly limited, copper is preferably used. The wiring may be in a thin film form wherein copper foil is used preferably with a thickness in a range of 5 $\mu$m to 18 $\mu$m and, more concretely, a thickness of 5 $\mu$m, 8 $\mu$m, 9 $\mu$m, 12 $\mu$m or 18 $\mu$m can be used appropriately. Furthermore, in the case wherein the wiring is formed of copper foil, it is preferable to plate the surface thereof to prevent deterioration of the wiring. Though the type of plating metal is not particularly limited, tin plating, gold plating or the like is preferably used.

The type of method for forming the wiring pattern on the above described polyimide-based insulating tape as well as the type of method for plating the surface of the wiring pattern are not particularly limited and well-known methods in the art are preferably used. An arbitrary wiring pattern is formed by etching the polyimide-based insulating tape to which copper foil having a thickness of 5 μm to 18 μm, for example, is attached and, then, tin plating or gold plating can be carried out on the surface of the wiring. In addition, polyimide, urethane, or the like, having insulating properties is applied to regions other than the predetermined exposed portions of the wiring patterns such as the region of the wiring pattern for conjugation of a semiconductor element as well as the region for an external connector so that a solder resist is formed to insulate the respective wirings each other. Thus, a flexible printed circuit having a thickness of 30 μm to 80 μm, for example, can be formed.

The type of semiconductor element mounted on this flexible printed circuit is not particularly limited as long as it has a configuration wherein a variety of integrated circuits are included in accordance with the application of the semiconductor device. For example, a liquid crystal display driver, a power IC, a controller, and the like, can be cited and, in particular, a semiconductor element having a great number of protruding electrodes (bumps) with a narrow pitch can be used, wherein electrodes electrically connected to the wiring pattern are formed in the form of protrusions.

Here, the protruding electrodes provided in the semiconductor element electrically connect the semiconductor element and the wiring. Though bumps, for example, are preferably used as the protruding electrodes, there are no particular limitations in regard to the type of protruding electrodes. In addition, though the material of the bumps is not particularly limited as long as it is conductive and can be appropriately connected to the wiring, gold is preferably used.

A thermosetting resin or a photo-curing resin such as an epoxy or acryl-based resin is used for the insulating resin composition for fixing a semiconductor element to the wiring via protruding electrodes so as to make an electrical connection. In the case wherein such resin is used, the insulating resin composition can easily be cured solely by irradiation with light or through the application of heat.

The rear surface of the insulating tape may be evacuated and sucked by a vacuum suction means in Step (A) of application of the insulating resin composition to the surface of the insulating tape. In this manner the insulating resin composition can be applied to the insulating tape in the condition wherein the insulating tape is supported in a flat manner without waves. Therefore, unevenness of the resin is reduced so that air can more easily escape to the outside at the time when pressure is applied to the semiconductor element placed on the insulating resin composition and the degree of failure of fill-in occurring due to enclosure of air can be further reduced.

In addition, the thickness of application of the insulating resin composition, which is applied to the conjugation region of a semiconductor element of the insulating tape, may be greater in the center portion than in the outer periphery portion of the conjugation region of the semiconductor element in the above described Step (A) of the manufacturing method for a COF semiconductor device of the present invention. Thus failure of fill-in can be further reduced.

In addition, the insulating resin composition may be applied in the form of ridges to the surface of the insulating tape while the resin discharging nozzle is being shifted within the conjugation region of the semiconductor element of the insulating tape wherein the resin discharging nozzle having a broad or large discharging outlet may be used at the time of this application in the above described Step (A) of the manufacturing method for a COF semiconductor device according to the present invention. Thus, the line width of the insulating resin composition applied in the form of ridges can be increased so that the total number of lines is reduced and, thereby, the number of recesses between the applied resin lines can be reduced so that failure of fill-in due to these resin recesses can be further reduced. Here, the course (track) of the shift of the resin discharging nozzle is selected at the time of resin application so that the number of applied resin lines is minimized and it may also be possible to the insulating tape while the resin discharging nozzle is fixed so that the number of applied resin lines is minimized.

In addition, a predetermined amount of a resin setting retardant may be mixed in advance into the thermosetting resin, which is the insulating resin composition, at the time of application of the insulating resin composition to the flexible printed circuit according to the present invention. Such a resin setting retardant is not particularly limited and a well-known retardant in the art can be appropriately used. Thus, the period of time from the application of the insulating resin composition to the flexible printed circuit to the mounting of the semiconductor element to the wiring pattern by means of pressure becomes long. Therefore, failure of the electrical connection between the electrodes (protruding electrodes) of the semiconductor element and the wiring pattern of the insulating tape does not occur even in the case wherein the amount of time to pre-heat the insulating tape is great after application of the insulating resin composition.

In addition, conductive particles may be dispersed into the insulating resin composition in advance at the time of application of the insulating resin composition according to the present invention. Gold-coated resin particles, nickel particles, or the like, having a particle diameter of 3 μm to 10 μm, for example, are used as these conductive particles. In this case, the particle density of the conductive particles is set at 2000 particles per one cubic millimeter to 12000 particles per one cubic millimeter in resin having a thickness of 5 μm, for example. Thus, some conductive particles are intervened between the electrodes of the semiconductor element and the wiring pattern of the insulating tape after resin molding and, therefore, defective connections can be prevented without fail. Here, the above described defective connections may easily occur in the case wherein the particle density of the conductive particles is below the above described range, and the insulating properties of the insulating resin composition for insulating the respective portions of the wiring pattern, as well as the electrodes of the semiconductor elements each other, are lowered in the case wherein the particle density of the conductive particles exceeds the above described range.

The pre-heat temperature in Step (D) for pre-heating the insulating resin composition so that bubbles can be removed via the insulating tape by pre-heating the insulating tape from the rear side before, during and/or after application of the insulating resin composition may be set at 60° C. to 150° C. and, more preferably, at 80° C. to 100° C., in accordance with the manufacturing method for a COF semiconductor device of the present invention. Thus, the resin viscosity can be lowered without affecting thermally the flexible printed circuit and without allowing the thermosetting resin to set so that sufficient leveling can be carried out and the moisture absorbed by the insulating tape or the outgassing at the time of resin curing can be removed in advance. Here, the moisture absorbed by the insulating tape or the outgassing at the time of resin curing cannot be sufficiently removed in advance nor can leveling be carried out so that failure of fill-in of the resin and residual bubbles easily occur in the case wherein this pre-heating temperature is below 60° C., and there is a risk wherein the curing of the insulating resin composition may progress, possibly causing defects in the electrical connection of the semiconductor element to the wiring pattern in the case wherein the pre-heating temperature exceeds 150° C.

In addition, the semiconductor element in the heated condition may be contacted to the wiring pattern through the application of pressure proceeding Step (B) of contacting the semiconductor element to the wiring pattern by means of application of pressure in the condition wherein the insulating resin composition is not yet cured according to the present invention. In this case a thermosetting resin is used for the insulating resin composition. A unit for transporting a semiconductor element while it is heated and for mounting the semiconductor element to the flexible printed circuit by means of application of pressure proceeding, which is well-known in the art, can be utilized. The heating temperature in this Step (B) is a temperature such that the thermosetting resin can be sufficiently set and the temperature is set at approximately 250° C. in the case of an epoxy-based resin, for example.

According to another aspect of the present invention a COF semiconductor device is provided comprising: a thin insulating tape on the surface of which a plurality of wiring patterns is arranged; a semiconductor element; and an insulating resin composition containing a resin setting retardant for fixing this semiconductor element to the wiring pattern in the condition wherein the semiconductor element is electrically connected to the wiring pattern and a highly reliable COF semiconductor device can be set up wherein bubbles and failure of fill-in occurring in the insulating resin composition at the time of conjugation of the semiconductor element to the wiring pattern of the thin insulating tape and resin molding are reduced.

In addition, the insulating resin composition may further contain conductive particles in a dispersed condition in this COF semiconductor device.

In the following a COF semiconductor device and a manufacturing method for the same according to the embodiments of the present invention are described in reference to the drawings. Here, the present invention is not limited to the embodiments.

[Embodiment 1]

FIGS. 1(a) to 1(e) are diagrams showing steps of a manufacturing method for a COF semiconductor device according to Embodiment 1 of the present invention. Here in FIGS. 1(a) to 1(e), which shows Embodiment 1, the same symbols are attached to the same elements as in the conventional examples 1 and 2 (FIGS. 5(a) to 5(d) and FIGS. 6(a) to 6(d)) described above.

Figure 3:
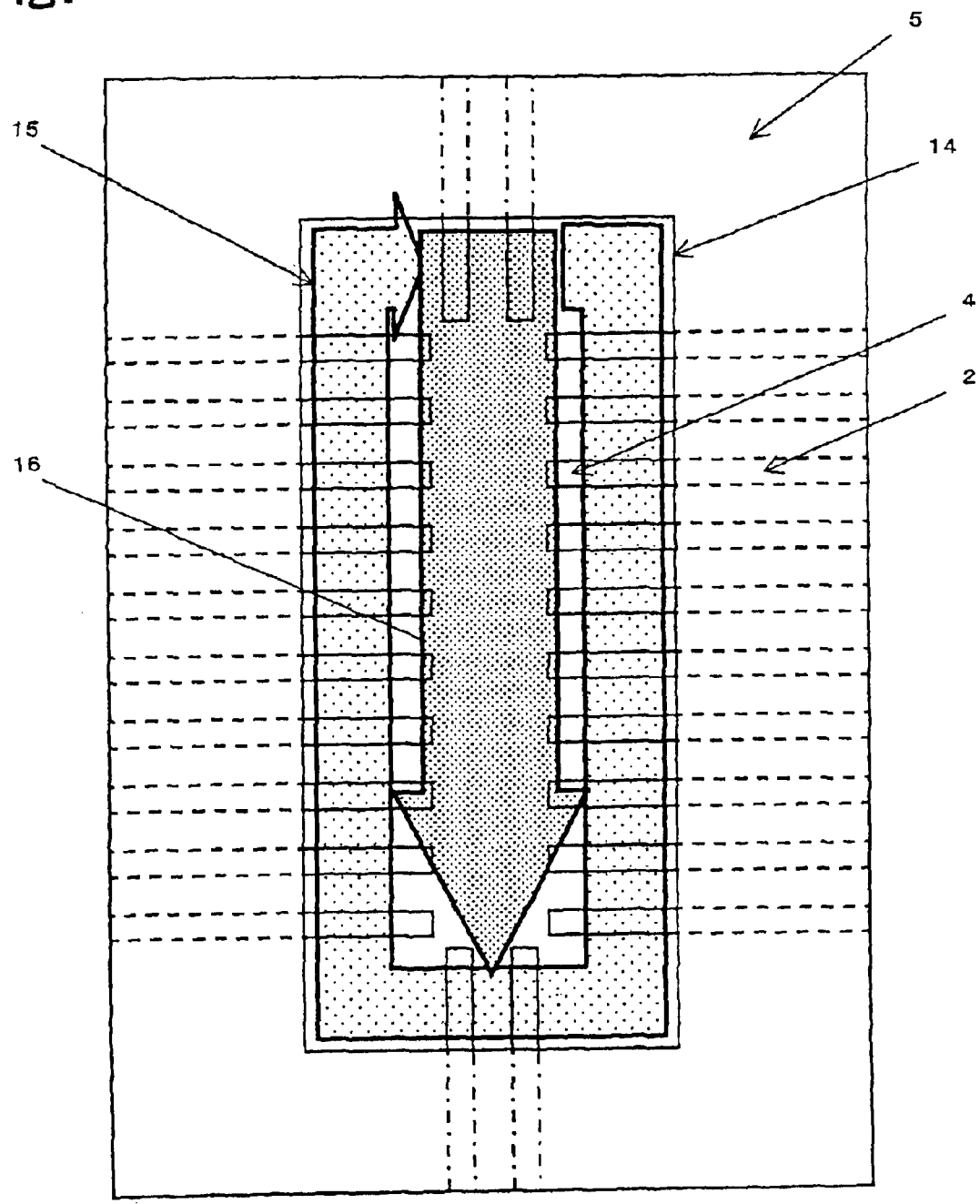
FIG. 3 is a diagram showing a resin application line for the process of resin application according to Embodiment 2 of the present invention.

The COF semiconductor device of this Embodiment 1 is provided, as shown in FIG. 1(e), with the following arrangements 1), 2), 3) and 4): 1) a thin insulating tape 1 on the surface of which a plurality of wiring patterns 2 is arranged; 2) a solder resist 5 for coating the wiring patterns 2 for insulation, except for predetermined regions such as the semiconductor element conjugation region and external connector portion in the wiring patterns 2; 3) a semiconductor element 3 having a plurality of protruding electrodes 9; and 4) an insulating resin compositions 7 for securing the semiconductor element 3 to the wiring pattern 2 in the condition wherein the protruding electrodes 9 of the semiconductor element 3 make an electrical connection, wherein a metal plating layer, not shown, is put on the surface of the wiring patterns 2. In Addition, a planar surface structure of the flexible printed circuit including the insulating tape 1, the wiring patterns 2 and the solder resist 5 is shown in FIG. 3.

Next, a manufacturing method for the COF semiconductor device of this Embodiment 1 is described. FIGS. 1(a) and 1(b) show Step (A) wherein resin is applied, FIG. 1(c) shows leveling and removal of bubbles after the application of the resin, FIG. 1(d) shows Step (B) wherein a semiconductor element is contacted by means of pressure proceeding and FIG. 1(e) shows Step (C) wherein resin is cured.

First, as shown in FIGS. 1(a) and 1(b), a flexible printed circuit is installed on a stage, not shown, according to the manufacturing method according to Embodiment 1. This stage may be a heating stage. After that, the rear surface (surface to which the semiconductor element is not mounted and on which the semiconductor element is not connected) of the insulating tape 1 is pre-heated at 80° C. to 100° C., as in arrows denoted by the symbol 6, by means of a heating stage or a heating tool. After that, the insulating resin composition 7, to which a resin setting retardant has been added in advance, is applied to the conjugation region 4, to the surface of which the semiconductor element of the insulating tape 1 is mounted and connected. In this case a thermosetting resin is used for the insulating resin composition 7. A predetermined amount of flow of the insulating resin composition 7 is dispensed to the conjugation region 4 while resin discharging nozzle 8, made of metal, is shifted back and forth by means of, for example, a nozzle shift means, not shown, in order to apply the insulating resin composition 7.

Thus, pre-heating is carried out from the rear surface side of the insulating tape 1 before the semiconductor element is mounted and connected and, thereby, the moisture absorbed by the insulating tape 1 and outgassing at the time of curing of the insulating resin composition 7 are removed as in arrows denoted by the symbol 10, shown in FIG. 1(c), and the applied insulating resin composition 7 is smoothed so as to reduce unevenness of the surface of the resin.

Then, as shown in FIGS. 1(d) and 1(e), the semiconductor element 3 is pressed against the insulating resin composition 7, as in arrows denoted by the symbol 11, while the semiconductor element 3 is heated at approximately 250° C. by means of a heating tool, not shown, in the condition wherein the flexible printed circuit, to which the insulating resin composition 7 has been applied, is pre-heated. Thereby, the respective protruding electrodes 9 of the semiconductor element 3 are pressed against, and electrically connected to the respective wiring patterns 2 on the surface of the insulating tape 1 in order to mount the semiconductor element 3 to the flexible printed circuit. At the same time, as the above, some of the insulating resin composition 7 is squeezed outward from beneath the semiconductor element 3, as in arrows denoted by the symbol 12, so as to form fillets on the sides of the semiconductor element 3.

The insulating resin composition 7 is thermo-set by heat from the semiconductor element 3, which undergoes heating, and by heat from the insulating tape 1, which undergoes pre-heating, so as to mold and secure the semiconductor element 3. Here, a liquid crystal panel, a printed circuit board, and the like, are connected to the external connectors of the wiring patterns 2 in a post-processing.

According to Embodiment 1 of the present invention: The moisture absorbed by the insulating tape 1 and outgassing at the time of the curing of the insulating resin composition 7 are removed in advance; the applied insulating resin composition 7 is smoothed to reduce the unevenness of the surface of the resin; and the insulating resin composition 7 is utilized together with a resin setting retardant; and, thereby, bubbles and failure of fill-in that occur at the time of conjugation of the protruding electrodes 9 of the semiconductor element 3 to the wiring patterns 2 of the insulating tape 1, and molding with the insulating resin composition, can be reduced to 30% or less, of the prior art. Also, the protruding electrodes 9 of the semiconductor element 3 can be electrically connected to the wiring patterns 2 without fail even in the case wherein the period of time of pre-heating of the insulating resin composition 7 is long.

[Embodiment 2]

FIGS. 2(a) to 2(e) are diagrams showing the steps of a manufacturing method for a COF semiconductor device according to Embodiment 2 of the present invention and FIG. 3 is a diagram showing a resin application line for the process of resin application according to Embodiment 2 of the present invention. Here in FIGS. 2(a) to 2(e) and FIG. 3 showing Embodiment 2, the same symbols are attached to the same elements as in Embodiment 1 (FIGS. 1(a) to 1(e)).

Figure 2:
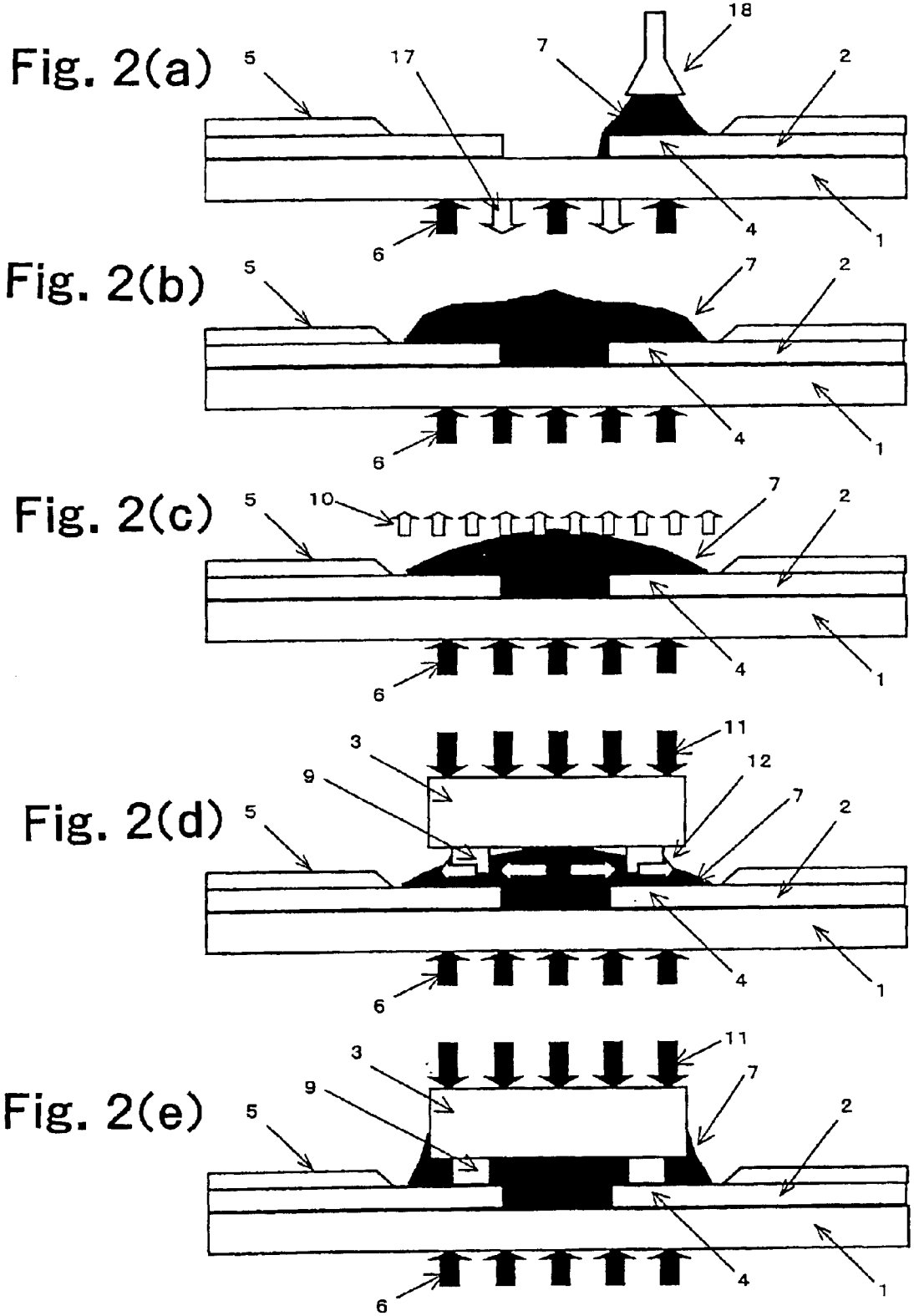
FIGS. 2(a) to 2(e) are diagrams showing the steps of a manufacturing method for a COF semiconductor device according to Embodiment 2 of the present invention.

The COF semiconductor device of this Embodiment 2 is formed to have the same components and same structure as in Embodiment 1, as shown in FIG. 2(e), while the resin application process at the time of manufacture of the COF semiconductor device of Embodiment 2 differs from that of Embodiment 1. That is to say, an insulating resin composition 7 is applied to the conjugation region 4 starting from the outside (arrow denoted by the symbol 15) and moving towards the center (arrow denoted by the symbol 16) thereof at the time when the thermosetting insulating resin composition 7 is applied together with resin setting retardant to the conjugation region 4, to which a semiconductor element 3 of an insulating tape 1 is connected and mounted, so that the amount of the insulating resin composition 7 applied to the center is greater than the amount applied to the periphery and the thickness of application in the center is greatest, as shown in FIGS. 2(a), 2(b) and FIG. 3, in Embodiment 2 and, thereby, air can more easily escape at the time of mount of the semiconductor element 3 to the insulating tape 1. Furthermore, waves in the insulating tape 1 are reduced so that the insulating tape 1 is supported in a flat manner by means of vacuum suction from the rear surface of the insulating tape 1, as in arrows denoted by the symbol 17, using a vacuum suction means, which is not shown, before the application of the insulating resin composition 7. After that, the insulating resin composition 7 is applied using a resin discharging nozzle 18 having a broad discharging outlet and, thereby, unevenness of the surface of the resin due to waves in the insulating tape 1 is reduced while the number of resin lines (three lines in this case) that are applied in ridge form by the broad nozzle 18 is reduced so that the number of resin recesses is reduced.

Accordingly, as shown in FIG. 2(c), the insulating resin composition 7 that has been applied to the flexible printed circuit takes on a gentle hill-type shape, wherein the center portion is highest, when the insulating resin composition 7 is smoothed. Then as shown in FIGS. 2(d) and 2(e), air in the gap easily escapes to the outside when pressure is applied to the semiconductor element 3 which has been placed on the insulating resin composition 7. Therefore, bubbles in, and failure of fill-in of the insulating resin composition 7 can be further reduced after thermo-setting. Here, in addition to the above, moisture absorbed by the insulating tape 1 and outgassing at the time of the thermosetting of the insulating resin composition 7 are removed in advance and the insulating resin composition is utilized together with the resin setting retardant, in the same manner as in Embodiment 1. Thereby, bubbles and failure of fill-in that occur at the time of the conjugation of protruding electrodes 9 to the wiring patterns 2 of the insulating tape 1 and molding with the insulating resin composition 7 can be reduced to 30% or less, of the prior art. The electrical connection of the protruding electrodes 9 of the semiconductor element 3 to the wiring patterns 2 can be made without fail even in the case wherein the period of time of heating of the insulating resin composition 7 is long.

[Embodiment 3]

FIGS. 4(a) to 4(e) are diagrams showing a manufacturing method for a COF semiconductor device according to Embodiment 3 of the present invention. Here in FIGS. 4(a) to 4(e) showing Embodiment 3, the same symbols are attached to the same elements as in Embodiment 1 (FIGS. 1(a) to 1(e)) and as in Embodiment 2 (FIGS. 2(a) to 2(e) and FIG. 3).

Figure 4A:
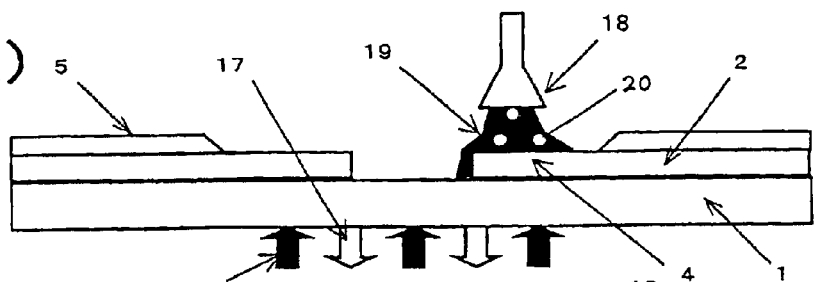
FIGS. 4(a) to 4(e) are diagrams showing a manufacturing method for a COF semiconductor device according to Embodiment 3 of the present invention.
Figure 4B:
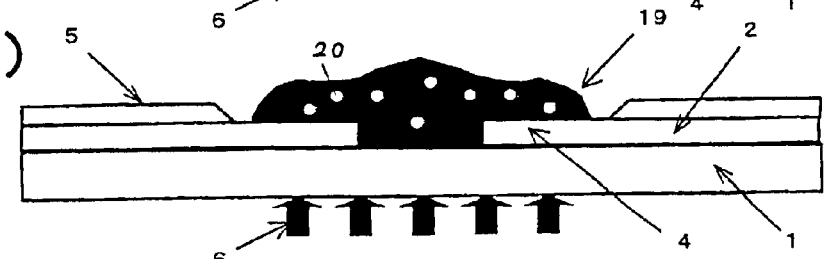
Figure 4C:
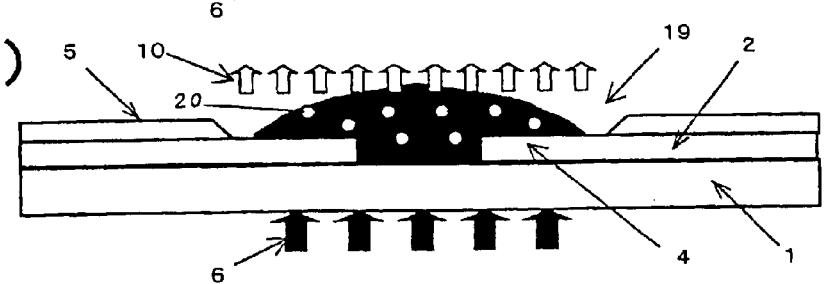
Figure 4D:
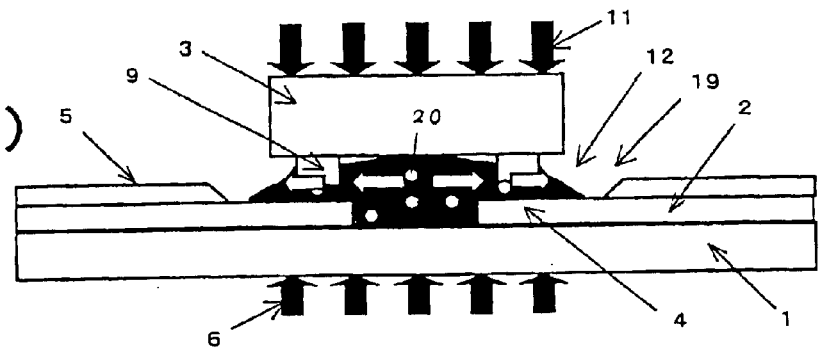
Figure 4E:
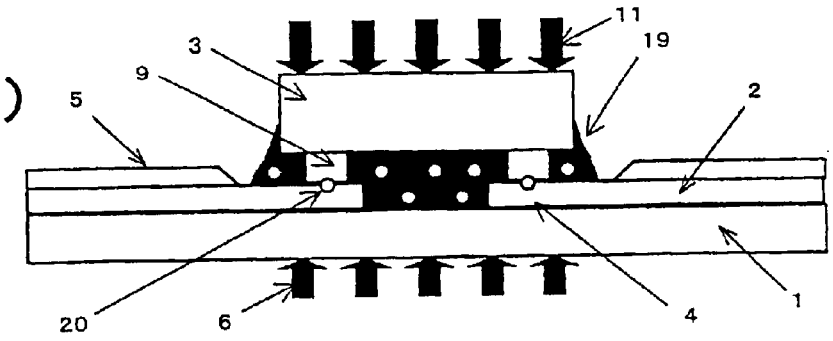
Figure 5A:
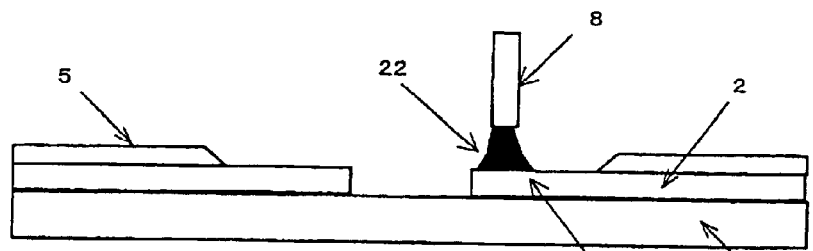
FIGS. 5(a) to 5(d) are diagrams showing a manufacturing method for a COF semiconductor device according to the conventional example 1 using the MBB.
Figure 5B:
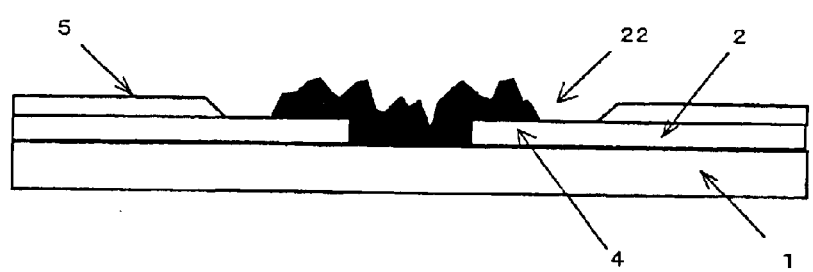
Figure 5C:
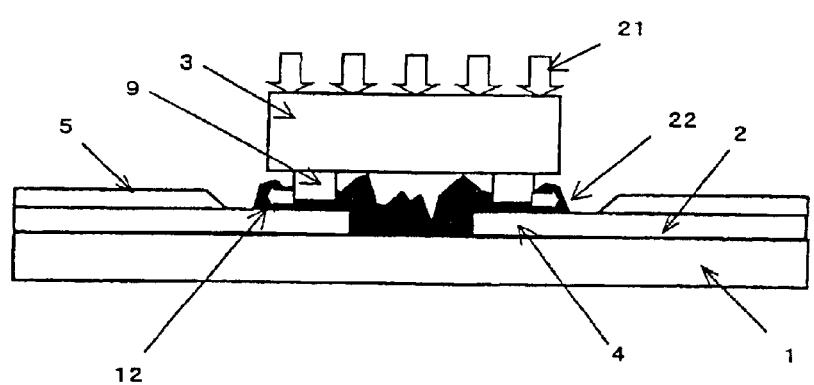
Figure 5D:
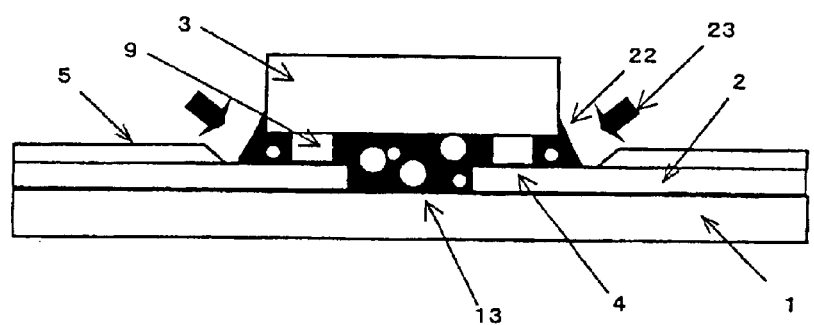
Figure 6A:
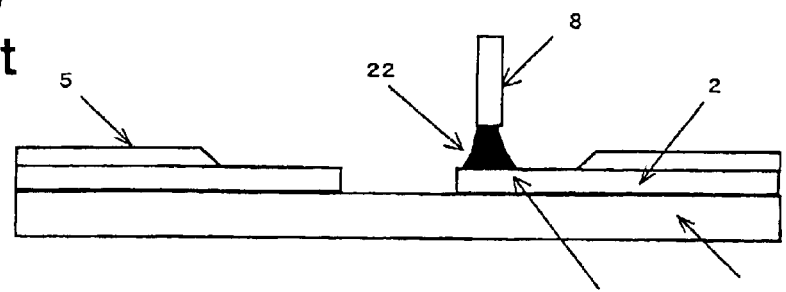
FIGS. 6(a) to 6(d) are diagrams showing a manufacturing method for a COF semiconductor device according to the conventional example 2 using the MBB.
Figure 6B:
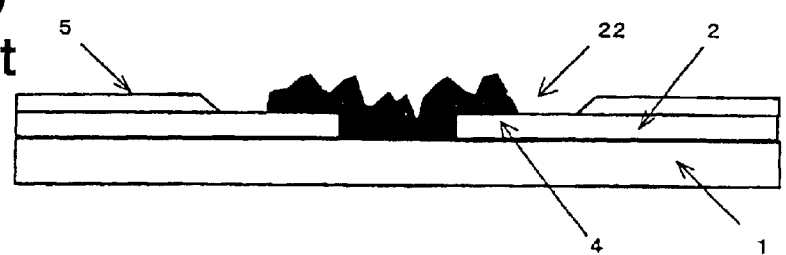
Figure 6C:
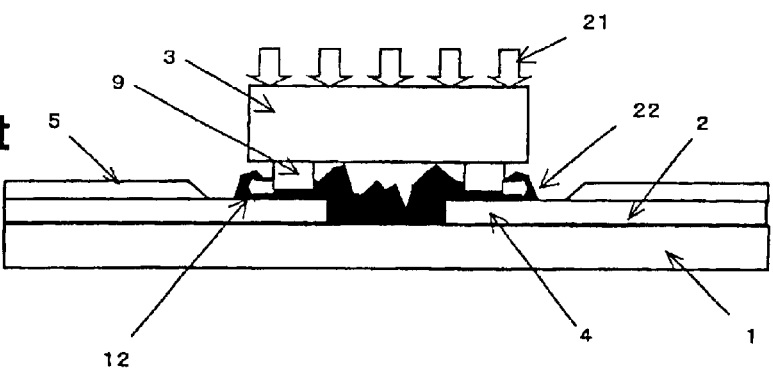
Figure 6D:
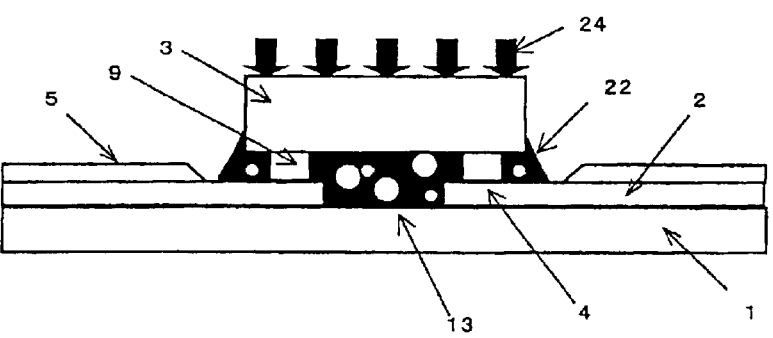

The COF semiconductor device of this Embodiment 3 is formed so as to have the same structure as in Embodiment 2 according to the manufacturing method of Embodiment 2, as shown in FIG. 4(e), while an insulating resin composition 19 utilized at the time of manufacture of the COF semiconductor device differs from that in Embodiments 1 and 2. That is to say, conductive particles 20 are dispersed in the thermosetting insulating resin composition 19 in advance at the time of application of the insulating resin composition 19 according to Embodiment 3. In this case, gold-coated resin particles having a diameter of 5 $\mu$m are used as the conductive particles 20, wherein the particle density of the conductive particles 20 is approximately 3000 per one cubic millimeter in the resin of a thickness of 5 $\mu$m. Here, all of the white dots in the insulating resin composition 19 shown in FIGS. 4(a) to 4(e) represent the conductive particles 20.

The insulating resin composition 19, in which the above described conductive particles 20 are dispersed, is used and protruding electrodes 9 of semiconductor element 3 are pressed against the wiring pattern 2 via the conductive particles 20 at the time when pressure is applied to semiconductor element 3, which has been placed on the insulating resin composition 19, so that a semiconductor element 3 is mounted on the flexible printed circuit, as shown in FIGS. 4(a) to 4(e). Therefore, defects in connections between the semiconductor element 3 and the wiring patterns 2 can be prevented without fail. Here in this Embodiment 3, also, moisture absorbed by the insulating tape 1 and outgassing at the time of the thermosetting of the insulating resin composition 19 are removed in advance; an insulating resin composition 7 that has been applied to the flexible printed circuit is leveled so as to form a gentle hill-type shape, wherein the center portion is highest; and the insulating resin composition is utilized, together with the resin setting retardant, in the same manner as in Embodiments 1 and 2. Thereby, bubbles and failure of fill-in that occur at the time of the conjugation of the protruding electrodes 9 to the wiring patterns 2 of the insulating tape 1 and molding with the insulating resin composition 7 can be reduced to 30% or less, of the prior art and the electrical connection of the protruding electrodes 9 of the semiconductor element 3 to the wiring patterns 2 can be made without fail even in the case wherein the period of time of pre-heating of the insulating resin composition 7 is long.

OTHER EMBODIMENTS

1. Though a case wherein a thermosetting resin is used as the insulating resin composition is illustrated in the above described Embodiments 1 to 3, a photo-curing resin may be used. In this case, the heating of the semiconductor element at the time when pressure is applied to the semiconductor element, which has been placed on the resin applied to the flexible printed circuit, is omitted. In addition, the insulating tape may be transparent so that the photo-curing resin can be irradiated with light from the rear side of the insulating tape at the time when the photo-curing resin is irradiated with light so as to be cured.

2. Though a case is illustrated in the above described Embodiments 1 to 3 wherein pre-heating of the insulating resin composition is sequentially carried out from to the resin pre-application step to the resin curing step, the pre-heating may be selectively carried out before, during, and after the application of the resin, or a combination of these.

3. The effects of the reduction of bubbles and failure of fill-in differ slightly according to the present invention depending on combinations of: pre-heating temperature and pre-heating period of time of the insulating resin composition, types of insulating resin compositions and curing methods for the insulating resin compositions as well as the presence or absence of vacuum suction. Therefore, it is desirable to select combinations of the above in accordance with the size of the product to be manufactured, the pattern and the method of application in order to gain optimal effect.

According to the present invention, the portions of the rear surface of an insulating tape wherein no wiring patterns are arranged, are pre-heated before, during and/or after application of the insulating resin composition to the wiring patterns in a region to which a semiconductor element is conjugated. Thereby, moisture absorbed by the insulating tape and outgassing at the time of resin curing are removed in advance and the insulating resin composition is leveled (smoothed) so as to reduce the recess of the resin between the applied lines so that air can easily escape to the outside at the time when pressure is applied to the semiconductor element placed on the insulating resin composition. Accordingly, a COF semiconductor device having a high reliability can be gained wherein bubbles, and/or failure of fill-in, can be greatly reduced in the insulating resin composition at the time of conjugation of the semiconductor element to the wiring pattern on the insulating tape and molding with the insulating resin composition, wherein leaks between electrodes of the semiconductor elements and corrosion of the aluminum electrodes of the semiconductor element do not occur.

What is claimed is:

1. A manufacturing method for a COF semiconductor device, comprises:
   Step (A) of applying an insulating resin composition to a surface of an insulating tape on the surface of which a plurality of wiring patterns is arranged;
   Step (B) of pressably contacting a semiconductor element to the wiring patterns in the condition wherein the insulating resin composition is not yet cured;
   Step (C) of fixing the semiconductor element to the wiring patterns so as to be electrically connected by curing the insulating resin composition; and
   Step (D) of pre-heating the insulating tape from the rear surface side before, during, and/or after the application of the insulating resin composition.

2. The method of claim 1, wherein the semiconductor element in the heated condition is contacted to the wiring pattern through the application of pressure proceeding in Step (B).

3. The method of claim 1, wherein the pre-heat temperature in Step (D) is set at 60° C. to 150° C.

4. The method of claim 1, wherein the resin setting retardant is mixed into the insulating resin composition.

5. A manufacturing method for a COF semiconductor device, comprises:
   Step (A) of applying an insulating resin composition to a surface of an insulating tape on the surface of which a plurality of wiring patterns is arranged;
   Step (B) of pressably contacting a semiconductor element to the wiring patterns in the condition wherein the insulating resin composition is not yet cured; and
   Step (C) of fixing the semiconductor element to the wiring patterns so as to be electrically connected by curing the insulating resin composition, wherein
   the thickness of application of the insulating resin composition, which is applied to the conjugation region of a semiconductor element of the insulating tape is greater in the center portion than in the outer periphery portion of the conjugation region of the semiconductor element in Step (A).

6. A manufacturing method for a COF semiconductor device, comprises:
   Step (A) of applying an insulating resin composition to a surface of an insulating tape on the surface of which a plurality of wiring patterns is arranged;
   Step (B) of pressably contacting a semiconductor element to the wiring patterns in the condition wherein the insulating resin composition is not yet cured; and
   Step (C) of fixing the semiconductor element to the wiring patterns so as to be electrically connected by curing the insulating resin composition, wherein
   the rear surface of the insulating tape is evacuated and sucked by a vacuum suction means in Step (A).

7. A manufacturing method for a COF semiconductor device, comprises:
   Step (A) of applying an insulating resin composition to a surface of an insulating tape on the surface of which a plurality of wiring patterns is arranged;
   Step (B) of pressably contacting a semiconductor element to the wiring patterns in the condition wherein the insulating resin composition is not yet cured; and
   Step (C) of fixing the semiconductor element to the wiring patterns so as to be electrically connected by curing the insulating resin composition, wherein
   the insulating resin composition is applied in the form of ridges to the surface of the insulating tape while the resin discharging nozzle is being shifted within the conjugation region of the semiconductor element of the insulating tape wherein the resin discharging nozzle having a broad or large discharging outlet is used at the time in Step (A).

8. The method of claim 4, wherein a conductive particles is dispersed into the insulating resin composition.

* * * * *